United States Patent
Pavate et al.

[11] Patent Number: 6,139,701
[45] Date of Patent: Oct. 31, 2000

[54] COPPER TARGET FOR SPUTTER DEPOSITION

[75] Inventors: Vikram Pavate, San Jose; Seshadri Ramaswami, Saratoga; Murali Abburi, Santa Clara; Murali Narasimhan, San Jose, all of Calif.

[73] Assignee: Applied Materials, Inc., Santa Clara, Calif.

[21] Appl. No.: 09/272,974

[22] Filed: Mar. 18, 1999

Related U.S. Application Data

[63] Continuation-in-part of application No. 08/979,192, Nov. 26, 1997, Pat. No. 6,001,227.

[51] Int. Cl.[7] .................................................. C23C 14/34
[52] U.S. Cl. ........................ 204/192.17; 204/298.12; 204/298.13; 204/192.12; 204/192.15; 438/485; 257/665; 257/741
[58] Field of Search .................... 204/298.12, 298.13, 204/192.12, 192.15, 192.17; 438/485; 257/665, 741

[56] References Cited

U.S. PATENT DOCUMENTS

| | | | |
|---|---|---|---|
| 3,279,039 | 10/1966 | Nippert | 148/528 |
| 4,964,962 | 10/1990 | Nobutani et al. | 204/192.3 |
| 5,196,916 | 3/1993 | Ishigami et al. | |
| 5,268,236 | 12/1993 | Dumont et al. | |
| 5,447,616 | 9/1995 | Satou et al. | |
| 5,456,815 | 10/1995 | Fukuyo et al. | |
| 5,803,342 | 9/1998 | Kardokus | 228/173.2 |
| 5,809,393 | 9/1998 | Dunlop et al. | |
| 6,001,227 | 12/1999 | Pavate et al. | |

FOREIGN PATENT DOCUMENTS

| | | |
|---|---|---|
| 882813 | 12/1998 | European Pat. Off. |
| 0 466 617 | 1/1992 | France. |
| 31 21 389A | 8/1982 | Germany. |
| 196 09 439 | 9/1996 | Germany. |
| 5-174828 | 7/1993 | Japan. |
| 10-60633 | 3/1998 | Japan. |
| 11-158614 | 6/1999 | Japan. |

OTHER PUBLICATIONS

Cox, J. Phys. D: Appl. Phys., vol. 7, pp 143–150 (month unknown), 1974.
Murr et al., "Microstructural aspects of hypervelocity impact cratering and jetting in copper", Journal of Material Science, 31 pp. 5915–5932, Nov. 1996.
Derwent Abstract No. 1999–435724, Jul. 1999.
Patent Abstracts of Japan, abstract for JP 3–64,447, Mar. 1991.
Patent Abstracts of Japan, abstract for JP 6–280005, Oct. 1994.
Patent Abstracts of Japan, abstract for JP 6–17,246, Jan. 1994.

(List continued on next page.)

*Primary Examiner*—Alan Diamond
*Attorney, Agent, or Firm*—Valerie G. Dugan

[57] ABSTRACT

A copper sputtering target is provided for producing copper films having reduced in-film defect densities. In addition to reducing dielectric inclusion content of the copper target material, the hardness of the copper target is maintained within a range greater than 45 Rockwell. Within this range defect generation from arc-induced mechanical failure is reduced. Preferably hardness is achieved by limiting grain size to less than 50 microns, and most preferably to less than 25 microns. The surface roughness preferably is limited to less than 20 micro inches, or more preferably, less than 5 micro inches to reduce defect generation from field-enhanced emission. This grain size range preferably is achieved by limiting the purity level of the copper target material to a level less than 99.9999%, preferably within a range between 99.995% to 99.9999%, while reducing particular impurity levels.

40 Claims, 3 Drawing Sheets

OTHER PUBLICATIONS

G.T. Murray, Preparation and Characterzation of Pure Metals, Cubberley et al: "Metals Handbook, 9th Edition, vol. 2, Properties and Selection: Nonferrous Alloys and Pure Metals." Apr. 27, 1983, American Society for Metals, Oh, US XP002094554 86, PP. 709–713.

PCT Notification of Transmittal of the International Search Report from the International Searching Authority at the European Patent Office dated Mar. 16, 1999, 7 pages (for parent application No. 08/979,192, filed Nov. 26, 1997).

Derwent Abstract for JP 5–214519A, Aug. 1993.

B.M. Cox, "Variation of the critical breakdown field between copper electrodes in vacuo", J. Phys. D: Appl. Phys., vol. 7, 1974, pp. 143–150 (month unknown).

Vikram Pavate et al., "Correlation between Aluminum alloy sputtering target metallurgical characteristics, Arc initiation, and In–film defect density", SPIE vol. 3214, pp. 42–47 (Sep. 1997).

G. A. Farrall et al., "Further studies of electron emission areas on electropolished copper surfaces in vacuum", Journal of Applied Physics, vol. 46, No. 2, Feb. 1975, pp. 610–617.

Carol J. Bennette et al., "Electrical Breakdown between Metal Electrodes in High Vacuum. II. Experimental", Journal of Applied Physics, vol. 38, No. 2, Feb. 1967, pp. 634–640.

H.O. Schrade et al., "Analysis of the Cathode Spot of Metal Vapor Arcs", IEEE Transactions on Plasma Science, vol. PS–11, No. 3, pp. 103–110 (1983) (month unknown).

A.S. Pokrovskaya et al.: "Electrical Strength of Vacuum Gap With Electrodes Made of Carbographite Materials", Proceedings of the Sixth International Symposium on Discharges and Electrical Insulation in Vacuum, Swansea, UK, Jul. 1974, pp. 86–91.

K.G. Bouchard: "Vacuum Breakdown Voltages of Dispersion–Strenghtened Copper vs Oxygen–Free, High–Conductivity Copper*", *The Journal of Vacuum Science & Technology,* 1970 vol. 7 pp. 358–360 (month unkown).

COPPER TARGET FOR SPUTTER DEPOSITION

This application is a continuation-in-part of U.S. patent application Ser. No. 08/979,192, filed Nov. 26, 1997, now U.S. Pat. No. 6,001,227 titled "IMPROVED TARGET FOR USE IN MAGNETRON SPUTTERING OF ALUMINUM FOR FORMING METALLIZATION FILMS HAVING LOW DEFECT DENSITIES AND METHOD FOR MANUFACTURING AND USING SUCH TARGET".

FIELD OF THE INVENTION

The present invention relates generally to metal film deposition and more particularly to an improved copper target for reducing defect generation during copper film deposition.

BACKGROUND OF THE INVENTION

Metal films are used widely within semiconductor integrated circuits to make contact to and between semiconductor devices (i.e., metal interconnects). Because of the high densities required for modern integrated circuits, the lateral dimensions of interconnects, as well as the lateral dimensions between interconnects, have shrunk to such a level that a single defect can destroy an entire wafer die by shorting a junction region or open-circuiting a gate electrode of an essential semiconductor device. Defect reduction within interconnect metal films, therefore, is an ever-present goal of the semiconductor industry that increases in importance with each generation of higher density integrated circuits.

Interconnect metal films typically are deposited via physical vapor deposition within a plasma chamber, and more recently via high density plasma (HDP) deposition. In both processes, a target of to-be-deposited material (e.g., the metal comprising the interconnect) is sputtered through energetic ion bombardment that dislodges atoms from the target. The dislodged atoms travel to a wafer disposed below the target and form a metal film thereon. The metal film is patterned to form the interconnect.

The use of copper in place of aluminum as the interconnect material for semiconductor devices has grown in popularity due to copper's lower resistivity. As with aluminum target manufacturers, copper target manufacturers conventionally focus on the purity of the sputtering target to reduce defect densities or to otherwise affect deposition of high quality metal films. For instance, at considerable cost copper targets presently are available with purity levels greater than 99.9999%. However, despite purity levels in excess of 99.9999%, the defect densities of copper films deposited using such high purity targets remain unacceptably high.

Accordingly, a need exists for an economical copper target that produces copper films having reduced defect densities.

SUMMARY OF THE INVENTION

The present inventors have discovered that in addition to target purity, other factors are of significant importance to defect reduction as recognized and described in parent application, U.S. Ser. No. 08/979,192, filed Nov. 26, 1997. These other factors must be considered to reduce defect densities during plasma deposition as the purity of the target alone does not assure adequate metal film quality and high device yield.

Accordingly, the present inventors have discovered that in addition to target material purity, the following target material parameters have a direct affect on defect generation during sputter deposition of copper films: dielectric inclusion content (e.g., target material oxides, nitrides, etc.), porosity (e.g., non-conductive voids due to gas trapping during target formation), grain size, surface roughness and mechanical strength. With respect to aluminum targets, control of dielectric inclusions is of primary importance for controlling aluminum film quality. Reducing the concentration of dielectric inclusions such as $Al_2O_3$ within an aluminum target can decrease certain as-deposited or "in-film" defect densities (e.g., splat densities) by up to five fold.

With respect to copper, the present inventors have discovered that increasing the hardness of the copper target is as much a factor in defect reduction as dielectric inclusion concentration. Namely, a certain hardness range for the copper target is required to provide the copper target with sufficient mechanical/electrical strength to prevent localized mechanical breakdown during plasma processing. The preferred hardness for the copper target is greater than 45 Rockwell.

To control the hardness of the copper target, the target's grain size preferably is below 50 microns, and most preferably below 25 microns. The smaller the grain size, the harder the target. The surface roughness of the target prior to any deposition processing preferably is less than 20 micro inches, most preferably less than 5 micro inches.

In stark contrast to the present trend of copper target manufacturers, the preferred hardness, grain size, and surface roughness ranges are achieved by limiting the copper target's purity level to a level less than 99.9999%, preferably within the range from 99.995% to 99.9999% (e.g., less pure than previously believed necessary). This overall purity level range is maintained while the concentration levels of impurities that adversely affect a copper target's hardness are reduced (e.g., antimony, arsenic, bismuth, hydrogen, oxygen, sulfur, etc.). By thus maintaining the copper target's purity at or below 99.9999%, the copper target's hardness is increased to greater than 45 Rockwell and the preferred grain sizes and surface roughness are achieved. Despite this reduced purity, when in the proper hardness range, the inventive target outperforms conventional higher purity targets. Note that copper targets having purity levels below about 99.995% may produce copper films that adversely affect device performance (e.g., due to high impurity levels).

Other objects, features and advantages of the present invention, as well as the structure of various embodiments of the invention, will become more fully apparent from the following detailed description of the preferred embodiments, the appended claims and the accompanying drawings.

BRIEF DESCRIPTION OF THE DRAWINGS

The present invention is described with reference to the accompanying drawings. In the drawings, like reference numerals indicate identical or functionally similar elements. Additionally, the leftmost digit of a reference numeral identifies the drawing in which the reference numeral first appears.

DETAILED DESCRIPTION OF THE PREFERRED EMBODIMENTS

In order to understand the significance of the present invention, it is necessary to understand arc-induced defect generation within a plasma deposition chamber. Accordingly, FIG. 1 is a schematic diagram of a conventional magnetron sputtering system 100 employing an inventive copper target 102 manufactured to reduce defect generation during copper deposition.

Figure 1:
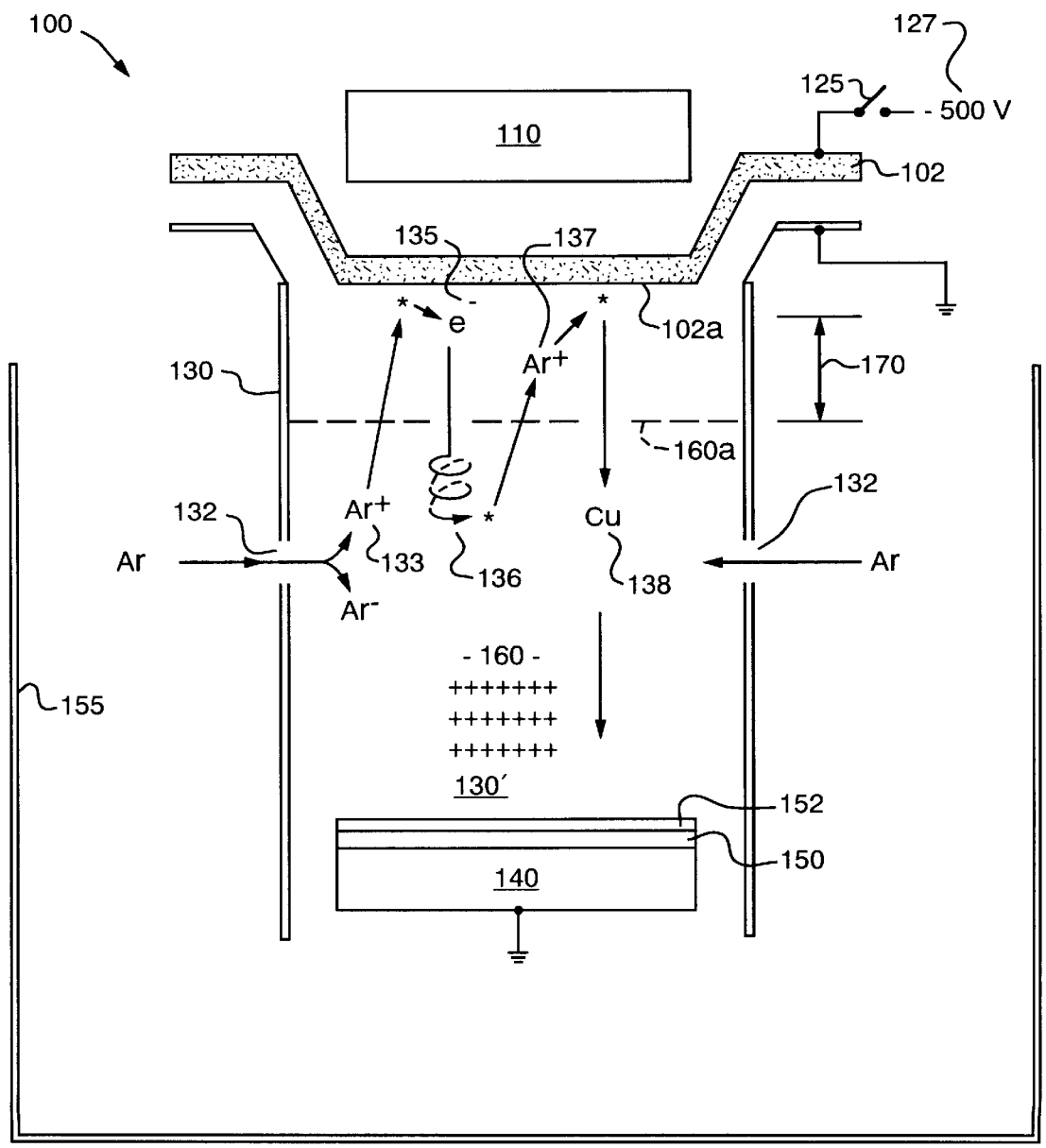
FIG. 1 is a schematic diagram of a conventional magnetron sputtering system employing an inventive copper target in accordance with the present invention.

With reference to FIG. 1, the magnetron sputtering system 100 comprises a magnet 110 positioned above the inventive copper target 102, and a switch 125 for connecting the target 102 to a negative, DC voltage source 127. A grounded shield 130 is positioned below the target 102 and has a plurality of apertures 132 that allow an inert gas such as argon (Ar) to flow into a region below the target 102 formed by the shield 130 (i.e., the shielded region 130')

The magnetron sputtering system 100 further comprises a substrate support 140 positioned within the shielded region 130' and below the target 102 for supporting a semiconductor substrate 150 during processing within the sputtering system 100. Like the shield 130, the substrate support 140 is grounded. A vacuum chamber 155 (partially shown) surrounds the shield 130 and the substrate support 140. At least a surface 102a of the target 102 is contained within the vacuum chamber 155 and shares a common environment with the shielded region 130 and the substrate support 140.

In operation, the chamber 155 is evacuated (e.g., via a vacuum pump not shown) to a pressure of about 2 to 5 milliTorr. The switch 125 is closed and a large negative voltage (e.g., about 500 volts) is placed on the target 102 relative to both the shield 130 and the substrate support 140. A corresponding electric field is produced between the target 102 and the shield 130, and between the target 102 and the substrate support 140. An inert gas such as argon (Ar) then is introduced into the shielded region 130' via the apertures 132.

Some of the argon atoms within the shielded region 130' are stripped of electrons due to the large electric field between the target 102 and the substrate support 140. Positively charged argon ions (Ar+) such as argon ion 133 thereby are formed. These positively charged argon ions accelerate toward and collide with the surface 102a of the negatively charged target 102.

As a result of these collisions, electrons such as electron (e–) 135, are emitted from the target 102. Each electron accelerates toward the substrate support 140 due to the electric field generated between the target 102 and the substrate support 140, and due to magnetic fields generated by the magnet 110, travels in a spiral trajectory 136. The spiraling electrons eventually strike argon atoms within the shielded region 130' so as to generate additional positively charged argon ions that accelerate toward and strike the target 102. Additional electrons thereby are admitted from the target 102, which generate additional positively charged argon ions, which generate additional electrons, etc. This feedback process continues until a steady-state plasma 160 is produced within the shielded region 130'.

As the plasma 160 reaches steady state, an area 170 essentially free of charged particles (i.e., a dark space 170), forms between the surface 102a of the target 102 and a top boundary 160a of the plasma 160. A large voltage differential exists between the surface 102a and the top boundary 160a and individual electrons emitted from the target 102 are believed to tunnel (e.g., in a wave form rather than in a particle form) through the dark space 170 so as to maintain this large voltage differential. As described further below, occasionally the dark space 170 is breached and a large flux of charged particles (similar to a flow of current) travels through the dark space 170 (i.e., an arc is produced).

In addition to electrons, due to momentum transfer between the argon ions (such as argon ion 137) and the target 102, target atoms (such as copper atom 138) are ejected or "sputtered" from the target 102. The sputtered target atoms travel to and condense on the semiconductor substrate 150 forming a thin film 152 of target material thereon. Ideally, the thin film 152 is highly uniform and defect free. However, as described in parent application U.S. Ser. No. 08/979,192, filed Nov. 26, 1997, a substantial number of blobs or splats of target material (i.e., splat defects or splats) appear within conventional thin films formed by sputter deposition with a conventional sputtering target.

The present inventors believe that splat defects result from arc-induced localized heating of the target that melts and liberates a portion of the target material. The liberated target material travels to the substrate 150, splatters thereon, cools and reforms, due to surface tension, as a splat defect in the thin film 152. Splats are very large (e.g., 500 $\mu$m) in relation to typical metal line widths (e.g., less than 1 $\mu$m) and affect device yield by shorting metal lines. It is believed that up to 50% of the in-film defects produced in current interconnect metallization schemes are induced, splat-type defects.

The present inventors have discovered that the following target material parameters have a direct affect on splat generation:

1. the number of dielectric inclusions such as target material oxides (e.g., $Al_2O_3$ for aluminum targets, CuO for copper targets, etc.);
2. the porosity of the target material (e.g., the number of non-conductive voids due to gas trapping during target formation);
3. the grain size of the target material;
4. the surface roughness of the target; and
5. the mechanical strength or hardness of the target.

As described in the parent application, U.S. Ser. No. 08/979,192, filed Nov. 26, 1997, with regard to aluminum targets, control of the number of dielectric inclusions within an aluminum target is of primary importance for reducing splat formation (e.g., all other causes create a minimal number of splats as compared to those caused by dielectric inclusions). Thus, other target manufacture parameters may be controlled less stringently without undue risk of significantly increased splat formation. However, in contrast to aluminum targets, the present inventors have discovered that the mechanical properties (e.g., mechanical strength/hardness, grain size, and surface roughness) of copper targets play a very significant role (in addition to dielectric inclusions) in splat formation during copper film deposition. Accordingly, the affects of dielectric inclusions, porosity and mechanical properties on splat formation and threshold values for acceptable values thereof are described below.

Figure 2:
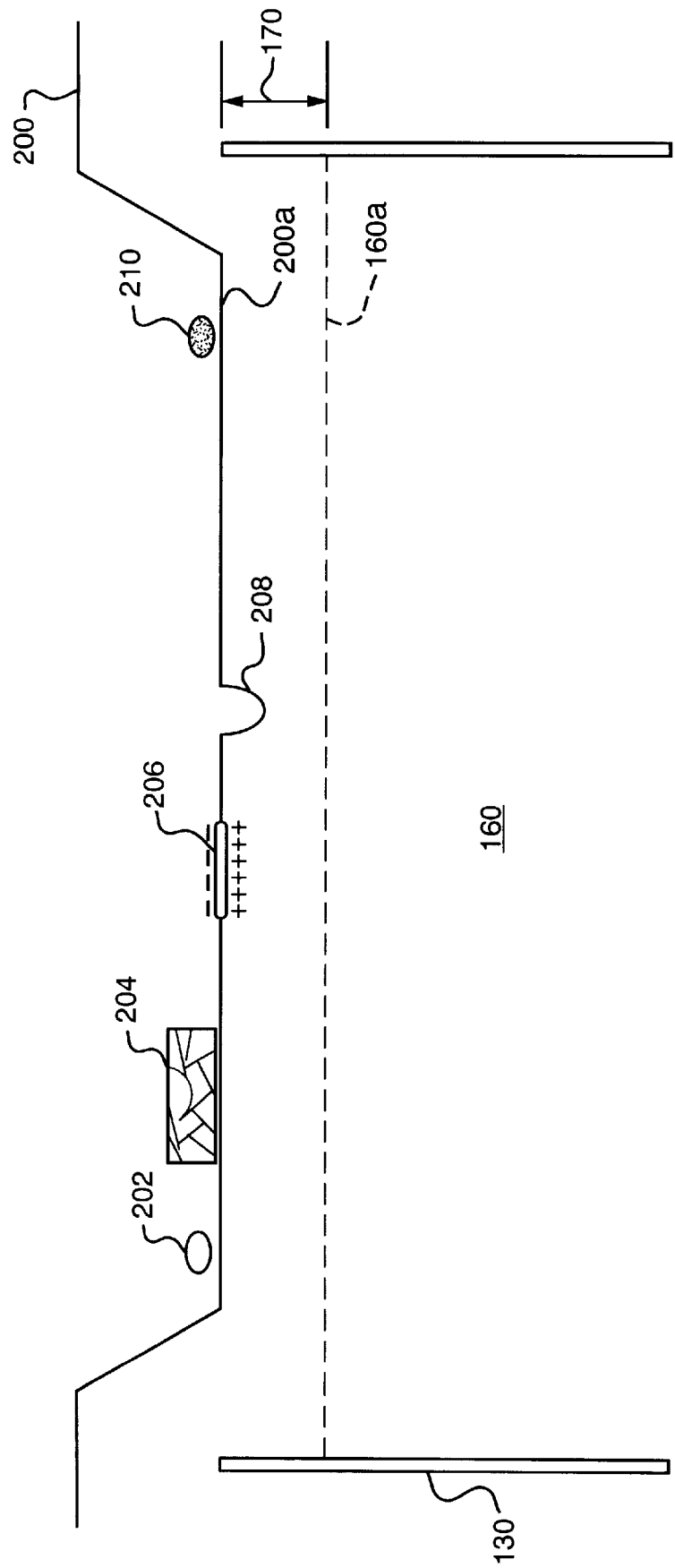
FIG. 2 is a schematic diagram of a conventional copper target.

FIG. 2 is a schematic diagram of a conventional copper target 200 adjacent the shield region 130'. A steady-state plasma 160 is maintained within the shield 130 and has a top plasma boundary 160a as previously described. Also, a dark space 170 exists between the plasma boundary 160a and a target surface 200a of the target 200.

For purposes of illustration, the conventional target 200 includes therein a void 202, a large grain size region (represented as large grain 204), a dielectric inclusion 206, a rough surface (represented as surface feature 208), and a trapped gas region 210. It will be understood that the void 202, the large grain 204, the dielectric inclusion 206, the surface feature 208, and the trapped gas region 210 (collectively "defect sources") are not to scale and are merely representative of general features of a conventional target. Further, the conventional target 200 has a large number (not shown) of these defect sources.

Experimentally, voids, large grain size regions, dielectric inclusions, surface features and trapped gas regions all have been observed to produce arcing during plasma processing. In general, the arcing is believed to result from abrupt electric field changes in the vicinity of the dark space 170 and the target defect.

The void 202, for instance, is believed to cause local increases in the electric field intensity through the dark space 170 when the void reaches the target surface 200a. The localized increases in electric field intensity can lead to an exponential increase in tunnel current (i.e., field-enhanced emission) between the void 202 and the plasma boundary 160a. If sufficient in magnitude, the enhanced tunnel current causes localized overheating and explosion of the target material in the vicinity of the void 202. This exploded target material leaves the target 200 and can form a splat defect during copper film deposition. A similar field-enhanced emission splat-formation mechanism is believed to exist for the surface feature 208 which protrudes into the dark space 170 and thereby enhances the electric field intensity and tunnel current in the vicinity of the surface feature.

The large grain 204, in addition to increasing the surface roughness of the target 200 (and thus field-enhanced emission splat formation), mechanically weakens the copper target 200. That is, a large grain size results in a soft, mechanically weak, target and a mechanically weak target is susceptible to mechanical failure during arcing. For instance, localized heating from an arcing event (e.g., due to a void, surface roughness, an inclusion, etc.) can lead to substantial localized thermal gradients that may fracture and dislodge a mechanically weak (e.g., due to large grain size) portion of the target 200. This dislodged target material can produce splats during copper film deposition.

Dielectric inclusions such as the inclusion 206 are believed to cause arcing due to at least two phenomena: dielectric breakdown and secondary electron heating. In dielectric breakdown, because the inclusion 206 is a non-conducting dielectric, any positively charged argon ions which strike the inclusion 206 charge the surface of inclusion 206 facing the plasma 160 (FIG. 2). A corresponding negative charge builds on the opposite face of the inclusion 206 (FIG. 2) to compensate for this positive charge. An electric field thereby is produced across the dielectric inclusion 206. This electric field builds in strength over time as more positive argon ions strike the surface of the inclusion 206, and eventually can reach the breakdown field strength of the dielectric inclusion 206. The inclusion 206 thereafter explodes and inclusion material and surrounding target material leave the target and can form a splat during copper film deposition.

Secondary electron heating is related to dielectric breakdown. As the argon ions strike the inclusion 206, little inclusion material is sputtered. However, as a result of the collisions electrons are ejected from the inclusion 206 (i.e., secondary electrons). To replenish the electrons ejected from the inclusion 206, electrons travel from the target 200 into the inclusion 206, producing a current on the backside of the inclusion 206. Because of the high resistance of the inclusion 206, the backside current heats the inclusion 206 and can melt both the inclusion 206 and surrounding target material. The melted inclusion material and target material leave the target and can form splats during copper film deposition. The melted inclusion material also can vaporize (e.g., forming a cathodic vapor), travel into the dark space 170, and create a current path that collapses the dark space 170. A high current thereafter may flow between the plasma 160 and the target surface 200a. The high current melts the inclusion 206 and surrounding target material producing additional splats. The entrapped gas region 210 is believed to form splats via both cathodic vapor induced arcing and field-enhanced emission induced arching.

Accordingly, to reduce arc-induced splat formation during plasma processing any target (e.g., aluminum, copper, etc.) preferably has the following properties: a reduced number of dielectric inclusions, non-porosity (e.g., few voids and little entrapped gas), and good mechanical properties (e.g., high strength or hardness, small grain size and little surface roughness). The significance each factor plays in splat formation, however, depends sensitively on the target material in question.

For instance, aluminum target material typically comprises an aluminum alloy such as AlCu (typically less than 0.5% Cu) that when manufactured with prior art methodologies, has sufficient mechanical strength and small enough grain size to prevent significant splat formation due to arc-induced mechanical failure and surface-roughness-induced field-enhanced emission. However, aluminum's primary dielectric inclusion ($Al_2O_3$) is highly resistive and charges easily when exposed to a plasma environment. Therefore, splat formation due to dielectric breakdown and secondary electron heating is common in aluminum targets. Accordingly, decreasing dielectric inclusion content (rather than improving mechanical properties) within an aluminum target is the primary mechanism for reducing splat formation during aluminum film formation.

With respect to reducing splat formation during copper film deposition, the present inventors have discovered that, in contrast to aluminum target induced defects, improving the mechanical properties of a copper target is as important as decreasing dielectric inclusion content to reduce on wafer splats. Because copper target material is highly pure copper and not an alloy, i.e., it is not purposefully alloyed with a second material, the hardness of the copper target material is dictated by the intrinsic hardness of copper and any impurities within the copper.

Copper is naturally a soft metal, and copper target material becomes softer as the purity level of the copper target material increases. Additionally, the grain size of the copper target material increases with increasing purity. Accordingly, the present inventors have discovered that above a certain purity level, splat formation during copper film deposition actually increases (due to arc-induced mechanical failure and surface-roughness-induced field-enhanced emission) with increasing levels of copper target material purity.

Further, the main dielectric inclusion within copper target material (e.g., CuO), is not as highly resistive as $Al_2O_3$. CuO, therefore, is less susceptible to charging at the inclusion to metal interface region, dielectric breakdown and secondary electron heating than is $Al_2O_3$, and splat formation due to dielectric inclusions is less pronounced for copper targets. Nonetheless, control of dielectric inclusion content within copper target material remains important.

Accordingly, to reduce splat formation during copper film deposition, a copper target is provided having both increased hardness and decreased inclusion content. Specifically, copper targets are produced having hardness values greater than 45 Rockwell. The inventors have discovered that copper targets having hardnesses greater than 45 Rockwell produce far fewer splats than softer copper targets. Copper targets having hardnesses up to 75 Rockwell have been tested and exhibit similar results (e.g., far fewer splats than softer copper targets).

To control hardness, the grain size of a copper target preferable is decreased. Grain size is decreased (and hardness increased) preferably by limiting copper target material purity to a level less than 99.9999%, preferably within a range between 99.995% to 99.9999% copper. This purity range is significantly less than the purity level of many commercially available copper targets, and is in stark contrast to the industry trend of using higher and higher purity copper targets.

Copper targets having purity levels in the range between 99.995% and 99.9999% can have hardnesses greater than 45 Rockwell if properly manufactured as described below. As stated, the inventors have discovered that copper targets having hardnesses within this range produce far fewer splat defects than softer, yet more pure, copper targets. Accordingly, copper targets with purity levels lower than conventional levels exhibit reduced splat formation, and, as an additional benefit, are much less costly to manufacture. TABLES 1 and 2 contain preferred and most preferred, respectively, copper target material parameter ranges for reducing splat formation during plasma processing, although a purity level less than 99.9999% copper is specifically contemplated by the inventors.

TABLE 1

| Purity level | 99.995% to 99.9999% |
|---|---|
| Antimony content | Less than about 0.03 ppm |
| Arsenic content | Less than about 0.03 ppm |
| Bismuth content | Less than about 0.03 ppm |
| Carbon content | Less than about 5.0 ppm |
| Hydrogen content | Less than about 1.0 ppm |
| Oxygen content | Less than about 5.0 ppm |
| Nitrogen content | Less than about 1.0 ppm |
| Sulfur content | Less than about 1.0 ppm |
| Metal grain size | Less than about 50 micron |
| (200) textured material | Greater than 50% |
| (111) textured material | Less than about 3% |
| Hardness | Greater than 45 (Rockwell scale) |
| Surface roughness | Less than about 20 micro-inches |
| Other Impurities | Less than about 10 ppm |

TABLE 2

| Purity level | 99.995% to 99.9999% |
|---|---|
| Antimony content | Less than about 0.03 ppm |
| Arsenic content | Less than about 0.03 ppm |
| Bismuth content | Less than about 0.03 ppm |
| Carbon content | Less than about 1.0 ppm |
| Hydrogen content | Less than about 1.0 ppm |
| Oxygen content | Less than about 1.0 ppm |
| Nitrogen content | Less than about 1.0 ppm |
| Sulfur content | Less than about 0.05 ppm |
| Metal grain size | Less than about 25 micron |
| (200) textured material | Greater than 50% |
| (111) textured material | Less than about 3% |
| Hardness | Greater than 45 (Rockwell scale) |
| Surface roughness | Less than about 5.0 micro-inches |
| Other Impurities | Less than about 10 ppm |

As previously stated, and as shown in TABLES 1 and 2, a copper target hardness greater than 45 Rockwell provides adequate localized material strength and immunity against mechanical fracturing to reduce splat formations during copper film deposition. This hardness range preferably is achieved by limiting grain size to less than about 50 microns (TABLE 1) and preferably less than about 25 microns (TABLE 2). This grain size range is achieved via selection of the purity range of 99.995% to 99.9999%.

Minimizing oxygen incorporation with the copper target material is very important for reducing metal oxide dielectric inclusions such as CuO. Further, limiting nitrogen and carbon content, while less important, reduces metal nitride and metal carbide inclusions, respectively.

Impurities that adversely affect mechanical properties of a copper target include antimony, arsenic, bismuth, hydrogen and sulfur. Antimony, arsenic, bismuth and sulfur reduce copper target hardness through interactions at copper grain boundaries. Sulfur, for instance, readily forms CuS at copper grain boundaries which renders a copper target brittle and susceptible to arc-induced mechanical failure. Accordingly, reducing antimony, arsenic, bismuth and sulfur content increases copper target mechanical strength, and can reduce splat formation.

Hydrogen is highly mobile in copper and embrittles copper by combining with copper oxide to form water ($H_2O$). Additionally, trapped hydrogen forms voids during casting of the copper target. Reducing hydrogen content, therefore, reduces splat formation by reducing arc-induced mechanical failure and field-enhanced emission due to gas trapping.

Other common impurities within copper target material include metallic impurities such as aluminum, iron, magnesium, silver and zinc. These metallic impurities usually are the highest concentration impurities and thus are the primary factors controlling grain size and hardness of the copper target. Therefore, one or more of the metallic impurities should be in the range of approximately 100 to 5000 ppm to maintain the purity level of the copper target material within the range of 99.995% to 99.9999%.

Metal working techniques such as forging, rolling and deforming alter the texture and hardness of the copper target. As known in the art, post-work metal texturing of at least 50% (200) texture and less than 3% (111) texture enhances uniformity of PVD deposition and is preferred.

Finally, providing a copper target with a smooth surface (e.g., less than 20 micro inches, more preferably less than 5 micro inches) reduces the number of sharp protrusions on the target's surface so as to reduce field-enhanced emission induced splat formation during copper film deposition. The smoothed surface should be ultrasonically cleaned prior to use to reduce arc-inducing surface contaminants that can otherwise permanently roughen the smoothed surface (e.g., via arcing during target burn-in).

With reference to FIG. 1, deposition of a copper film 152 having a substantially reduced in-film defect (e.g., splat) density is performed by:

1. providing an inventive copper target 102 having one or more properties in accordance with TABLE 1 and/or TABLE 2;
2. placing the semiconductor wafer 150 on the substrate support 140;
3. closing the switch 125 to bias the target 102 relative to the shield 130 and substrate support 140;
4. introducing argon into the shielded region 130 so as to produce a plasma 160; and
5. maintaining the plasma 160 until the desired thickness for the copper film 152 is formed on the substrate 140.

Rather than rapidly igniting the plasma 160 by applying full production level power to the target 102 (e.g., about 10 kw), preferably a slow ramp rate (e.g., 0.5 kw/sec to 2.0 kw/sec) is employed. Slow ramp rates reduce the electromechanical stress applied to the target 102 (e.g., by heating the target more uniformly to reduce thermal gradients) and thus prevent mechanical weakening of the target 102.

Primarily because the inventive copper target 102 is harder than conventional copper targets and has fewer dielectric inclusions, the copper film 152 has significantly fewer in-film defects than copper films deposited via conventional copper targets. Further, the cost of depositing the copper film 152 is reduced as the inventive copper target 102 is less expensive to manufacture than the ultra-high purity copper targets typically employed.

Figure 3:
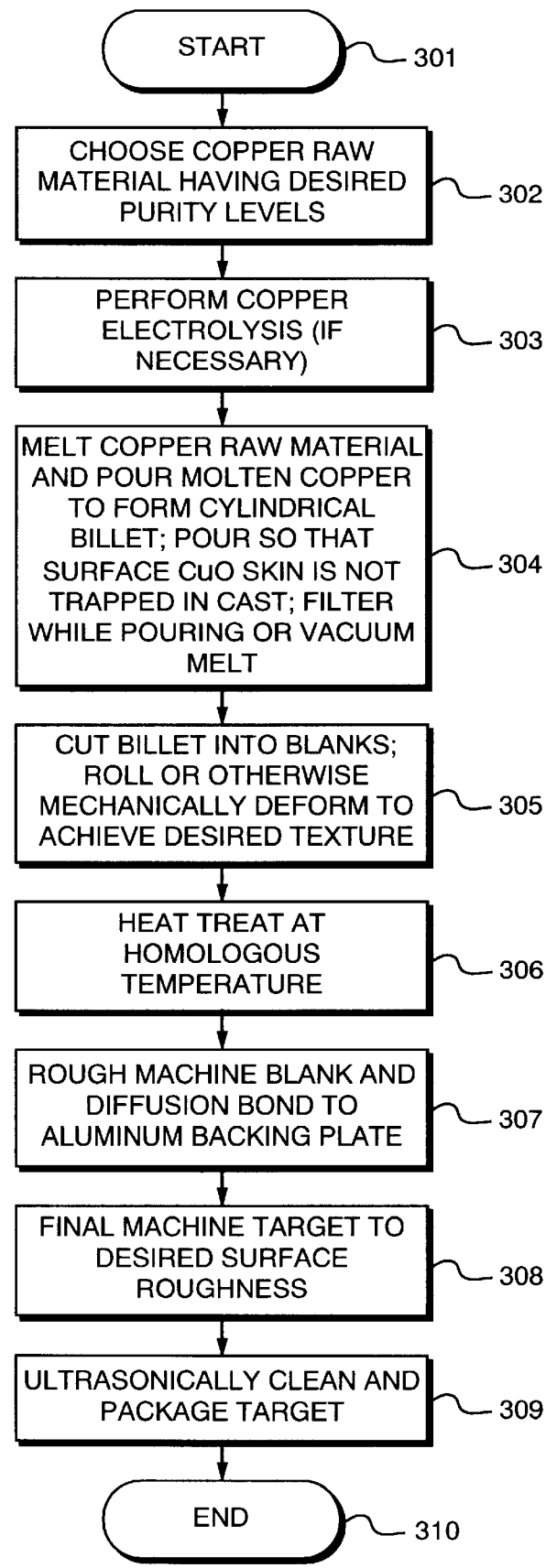
FIG. 3 is a flow chart of representative manufacturing steps for producing a copper target in accordance with the present invention.

FIG. 3 is a flowchart of typical manufacturing steps for producing the inventive copper target 102 having one or more of the mechanical properties and impurity levels indicated in TABLE 1 and/or TABLE 2. The manufacturing steps start at step 301 and end with step 310.

In step 302, copper raw material is selected having the desired low levels of antimony, arsenic, bismuth, carbon, oxygen, nitrogen and sulfur. To achieve the desired hardness, the purity range from 99.995% to 99.9999% should be maintained with either antimony, arsenic and bismuth all below 0.03 ppm, sulfur below 1 ppm or hydrogen below 1 ppm.

In step 303, copper electrolysis is performed on the copper raw material (if necessary) to increase copper purity to within the range from 99.995% to 99.9999%. Suitable copper electrolysis processes are well known in the art.

In step 304, the copper raw material is melted, and the molten copper is poured into a cast so as to form a cylindrical copper billet. To reduce oxygen incorporation during melt pouring, the melt is poured so that any copper oxide skin on the melt is not trapped within the copper cast. Such pouring methods are known in the art. Additionally, during pouring, the molten copper preferably is filtered as is known in the art, to remove CuO particles present in the molten copper. Vacuum melting may be similarly employed.

Once the copper cast has cooled, in step 305 the copper billet is cut into slices or "blanks". Each copper blank then is mechanically deformed by (e.g., by rolling) to achieve the desired (200) texture and (111) texture.

In step 306, a copper blank to be used as target material is annealed for about 1–2 hours at the homologous temperature of the copper target material (e.g., about 400–450° C.). Annealing the copper blank at its homologous temperature achieves two important objectives. First, the intrinsic stress within the copper blank is minimized, making a target formed therefrom less susceptible to mechanical fracturing during plasma processing. Second, the grain size of the copper blank is stabilized as the homologous temperature exceeds any processing temperature to which a copper target is exposed during physical vapor deposition or high density plasma processing. Finally, annealing at the homologous temperature (e.g., 400–450° C.) does not increase the content of CuO or CuS within the copper blank as CuO and CuS form at temperatures much higher than 450° C. (e.g., CuS forms at approximately 600° C., while CuO forms at approximately 850° C.).

In step 307, the copper blank is rough machined to smooth the edges of the blank. A copper target then is formed by diffusion bonding the copper blank to a backing plate.

In step 308, the to-be-sputtered surface of the copper target is final machined to achieve the desired surface roughness. Because of the small grain size within the inventive copper target 102, a surface roughness below 5 micro inches can be achieved.

Finally, following final machining, the copper target is ultrasonically cleaned and packaged in step 309. Ultrasonically cleaning the target's surface removes dielectric contaminants produced during the machining process. Dielectric surface contaminants are believed to initiate arcing and therefore are undesirable.

The foregoing description discloses only the preferred embodiments of the invention, modifications of the above disclosed apparatus and method which fall within the scope of the invention will be readily apparent to those of ordinary skill in the art. For instance, limiting the purity range of copper target material is the preferred method for increasing copper target hardness. However, it may be possible to alloy a copper target having purity levels higher than 99.9999% while still maintaining adequate copper target hardness and small grain size. Further, various manufacturing methods may be employed to achieve one or more of the desired ranges set forth in TABLES 1 and 2. The inventive copper targets described herein may be used for any suitable semiconductor manufacturing process (e.g., D.C. magnetron sputtering, high density plasma deposition, etc.).

Accordingly, while the present invention has been disclosed in connection with the preferred embodiments thereof, it should be understood that other embodiments may fall within the spirit and scope of the invention as defined by the following claims.

The invention claimed is:

1. A copper target for use in semiconductor device manufacturing characterized by:

a copper surface adapted to be located within a plasma deposition chamber and to be sputtered during a plasma sputtering process within the plasma deposition chamber so as to form a copper film on a substrate located within the plasma deposition chamber; and a hardness greater than 45 Rockwell.

2. The copper target of claim 1 further characterized by a grain size of less than 50 microns.

3. The copper target of claim 1 further characterized by a surface roughness of less than 20 micro inches.

4. The copper target of claim 1 further characterized by more than 50% material having (200) texture and less than 3% material having (111) texture.

5. The copper target of claim 1 further characterized by:

a grain size of less than 50 microns; and a surface roughness of less than 20 micro inches.

6. The copper target of claim 1 further characterized by a grain size of less than 25 microns.

7. The copper target of claim 1 further characterized by a surface roughness of less than 5 micro inches.

8. The copper target of claim 1 further characterized by:

a grain size of less than 25 microns; and a surface roughness of less than 5 micro inches.

9. The copper target of claim 1 further characterized by a purity level between 99.995% and 99.9999% and at least one of:

an antimony, an arsenic and a bismuth content each of less than 0.03 ppm;

a hydrogen content of less than 1.0 ppm;

an oxygen content of less than 5.0 ppm; and a sulfur content of less than 1.0 ppm.

10. The copper target of claim 1 further characterized by a purity level of less than 99.9999% and at least one of:

an antimony, an arsenic and a bismuth content each of less than 0.03 ppm;

a hydrogen content of less than 1.0 ppm;

an oxygen content of less than 5.0 ppm; and a sulfur content of less than 1.0 ppm.

11. The copper target of claim 1 further characterized by a purity level between 99.995% and 99.9999% and at least one of:
   an antimony, an arsenic and a bismuth content each of less than 0.03 ppm;
   a hydrogen content of less than 1.0 ppm;
   an oxygen content of less than 1.0 ppm; and
   a sulfur content of less than 0.05 ppm.

12. The copper target of claim 1 further characterized by a purity level of less than 99.9999% and at least one of:
   an antimony, an arsenic and a bismuth content each of less than 0.03 ppm;
   a hydrogen content of less than 1.0 ppm;
   an oxygen content of less than 1.0 ppm; and
   a sulfur content of less than 0.05 ppm.

13. A copper target for use in semiconductor device manufacturing characterized by:
   an antimony, an arsenic and a bismuth content each of less than 0.03 ppm; and
   a grain size of less than 50 microns.

14. The copper target of claim 13 further characterized by a grain size of less than 25 microns.

15. The copper target of claim 13 further characterized by a surface roughness of less than 20 micro inches.

16. The copper target of claim 15 further characterized by a surface roughness of less than 5 micro inches.

17. The copper target of claim 14 further characterized by a surface roughness of less than 5 micro inches.

18. The copper target of claim 13 further characterized by a purity level between 99.995% and 99.9999% and at least one of:
   a carbon content of less than 5.0 ppm;
   a hydrogen content of less than 1.0 ppm;
   an oxygen content of less than 5.0 ppm; and
   a sulfur content of less than 1.0 ppm.

19. The copper target of claim 13 further characterized by a purity level less than 99.9999% and at least one of:
   a carbon content of less than 5.0 ppm;
   a hydrogen content of less than 1.0 ppm;
   an oxygen content of less than 5.0 ppm; and
   a sulfur content of less than 1.0 ppm.

20. The copper target of claim 14 further characterized by a purity level between 99.995% and 99.9999% and at least one of:
   a hydrogen content of less than 1.0 ppm;
   an oxygen content of less than 1.0 ppm; and
   a sulfur content of less than 0.05 ppm.

21. The copper target of claim 14 further characterized by a purity level less than 99.9999% and at least one of:
   a hydrogen content of less than 1.0 ppm;
   an oxygen content of less than 1.0 ppm; and
   a sulfur content of less than 0.05 ppm.

22. A copper target for use in semiconductor device manufacturing characterized by:
   a purity level between 99.995% and 99.9999%;
   an antimony, an arsenic and a bismuth content each of less than 0.03 ppm; and at least one of:
      a hydrogen content of less than 1.0 ppm;
      an oxygen content of less than 5.0 ppm; and
      a sulfur content of less than 1.0 ppm.

23. The copper target of claim 22 further characterized by at least one of:
   an oxygen content of less than 1.0 ppm; and
   a sulfur content of less than 0.05 ppm.

24. A copper target for use in semiconductor device manufacturing characterized by:
   a purity level less than 99.9999%;
   an antimony, an arsenic and a bismuth content each of less than 0.03 ppm; and at least one of:
      a hydrogen content of less than 1.0 ppm;
      an oxygen content of less than 5.0 ppm; and
      a sulfur content of less than 1.0 ppm.

25. A method of producing a copper film having a reduced in-film defect level comprising:
   providing a semiconductor wafer;
   providing a copper target characterized by:
      a copper surface adapted to be located within a plasma deposition chamber and to be sputtered during a plasma sputtering process within the plasma deposition chamber so as to form a copper film on a substrate located within the plasma deposition chamber; and
      a hardness greater than 45 Rockwell; and
   sputtering the copper target so as to deposit a copper film on the semiconductor wafer.

26. The method of claim 25 wherein providing a copper target further comprises providing a copper target characterized by:
   a grain size of less than 50 microns; and
   a surface roughness of less than 20 micro inches.

27. The method of claim 25 wherein providing a copper target further comprises providing a copper target characterized by:
   a grain size of less than 25 microns; and
   a surface roughness of less than 5 micro inches.

28. The method of claim 25 wherein providing a copper target further comprises providing a copper target characterized by a purity level between 99.995% and 99.9999% and at least one of:
   an antimony, an arsenic and a bismuth content each of less than 0.03 ppm;
   a hydrogen content of less than 1.0 ppm;
   an oxygen content of less than 5.0 ppm; and
   a sulfur content of less than 1.0 ppm.

29. A semiconductor device fabricated by the method of claim 25.

30. A method of producing a copper film having a reduced in-film defect level comprising:
   providing a semiconductor wafer;
   providing a copper target characterized by:
      a grain size of less than 50 microns;
      a surface roughness of less than 20 micro inches;
      a purity level between 99.995% and 99.9999%
      an antimony, an arsenic and a bismuth content each of less than 0.03 ppm; and at least one of:
         a hydrogen content of less than 1.0 ppm;
         an oxygen content of less than 5.0 ppm; and
         sulfur content of less than 1.0 ppm; and sputtering the copper target so as to deposit a copper film on the semiconductor wafer.

31. The method of claim 30 wherein providing a copper target further comprises providing a copper target characterized by:
   a grain size of less than 25 microns;
   a surface roughness of less than 5 micro inches; and
   a purity level between 99.995% and 99.9999% and at least one of:

an oxygen content of less than 1.0 ppm; and sulfur content of less than 0.05 ppm.

32. A semiconductor device formed by the method of claim 30.

33. A method of producing a copper film having a reduced in-film defect level comprising:

providing a semiconductor wafer;

providing a copper target characterized by:
- a grain size of less than 50 microns;
- a surface roughness of less than 20 micro inches;
- a purity level less than 99.9999%;
- an antimony, an arsenic and a bismuth content each of less than 0.03 ppm; and at least one of:
  - a hydrogen content of less than 1.0 ppm;
  - an oxygen content of less than 5.0 ppm; and
  - sulfur content of less than 1.0 ppm; and sputtering the copper target so as to deposit a copper film on the semiconductor wafer.

34. A semiconductor device formed by the method of claim 33.

35. A copper target for use in semiconductor device manufacturing characterized by:

a hardness greater than 45 Rockwell;

a purity level between 99.995% and 99.9999%; and at least one of:
- an antimony, an arsenic and a bismuth content each of less than 0.03 ppm;
- a hydrogen content of less than 1.0 ppm;
- an oxygen content of less than 5.0 ppm; and
- a sulfur content of less than 1.0 ppm.

36. A copper target for use in semiconductor device manufacturing characterized by:

a hardness greater than 45 Rockwell;

a purity level between 99.995% and 99.9999%; and at least one of:
- an antimony, an arsenic and a bismuth content each of less than 0.03 ppm;
- a hydrogen content of less than 1.0 ppm;
- an oxygen content of less than 1.0 ppm; and
- a sulfur content of less than 0.05 ppm.

37. A method of producing a copper film having a reduced in-film defect level comprising:

providing a semiconductor wafer;

providing a copper target characterized by:
- a hardness greater than 45 Rockwell;
- a grain size of less than 25 microns; and
- a surface roughness of less than 5 micro inches; and sputtering the copper target so as to deposit a copper film on the semiconductor wafer.

38. A method of producing a copper film having a reduced in-film defect level comprising:

providing a semiconductor wafer;

providing a copper target characterized by:
- a hardness greater than 45 Rockwell;
- a purity level between 99.995% and 99.9999%; and
- at least one of:
  - an antimony, an arsenic and a bismuth content each of less than 0.03 ppm;
  - a hydrogen content of less than 1.0 ppm;
  - an oxygen content of less than 5.0 ppm; and
  - a sulfur content of less than 1.0 ppm; and sputtering the copper target so as to deposit a copper film on the semiconductor wafer.

39. A copper target for use in semiconductor device manufacturing characterized by:

a copper surface adapted to be located within a plasma deposition chamber and to be sputtered during a plasma sputtering process within the plasma deposition chamber so as to form a copper film on a substrate located within the plasma deposition chamber; and a surface roughness of less than 20 micro inches.

40. The copper target of claim 39 further characterized by a surface roughness of less than 5 micro inches.

* * * * *